United States Patent [19]
Bergstrom

[11] 4,234,804
[45] Nov. 18, 1980

[54] SIGNAL CORRECTION FOR ELECTRICAL GAIN CONTROL SYSTEMS

[75] Inventor: Gary Bergstrom, Lexington, Mass.
[73] Assignee: DBX, Inc., Newton, Mass.
[21] Appl. No.: 943,859
[22] Filed: Sep. 19, 1978
[51] Int. Cl.³ .................... G06G 7/12; G06G 7/24
[52] U.S. Cl. .......................... 307/229; 307/230; 328/145; 328/160
[58] Field of Search ............. 307/229, 230; 328/144, 328/145, 160

[56] References Cited

U.S. PATENT DOCUMENTS

| | | | |
|---|---|---|---|
| 3,657,528 | 4/1972 | Plante | 328/145 |
| 3,681,618 | 8/1972 | Blackmer | 328/145 |
| 3,714,462 | 1/1973 | Blackmer | 307/229 |
| 3,855,101 | 12/1974 | Wilson | 307/229 |

*Primary Examiner*—Stanley D. Miller, Jr.
*Assistant Examiner*—B. P. Davis
*Attorney, Agent, or Firm*—Schiller & Pandiscio

[57] ABSTRACT

The present invention relates to an electrical gain control system which provides a first signal logarithmically related to an input signal, sums a gain control signal with the first signal; and then provides an output signal which is an antilogarithmic function of the sum of the gain control signal and first signal. In accordance with the present invention in order to at least partially compensate for errors in the output signal arising from inherent characteristics of the components of the system, the system is improved by comparing the input signal and the output signal; generating an error correction signal in response to the comparison as a function of the errors in the output signal; and summing the error correction signal with the first signal and the gain control signal so as to reduce the error in the output signal.

16 Claims, 8 Drawing Figures

SIGNAL CORRECTION FOR ELECTRICAL GAIN CONTROL SYSTEMS

This invention relates to electronic multipliers or gain control circuits, and more particularly to analog multipliers with logarithmic control responses.

Many systems, especially those used for audio signals, include signal gain circuits controlled in response to an electrical command signal. One such gain control circuit, also referred to as a "voltage control amplifier" or "VCA", is described and claimed in U.S. Pat. No. 3,714,462 issued to David E. Blackmer on Jan. 30, 1973 (the claimed circuits hereinafter referred to as the "Blackmer circuit"). The Blackmer circuit has been commercially successful, particularly for use in audio noise reduction systems, commonly referred to as "companders".

The Blackmer circuit is an analog device providing a logarithmic control response. The circuit generally includes first signal converting means for providing a first signal which is logarithmically related to the input signal, means for summing a gain control signal with the first signal, and second signal converting means. The latter is connected to the first signal converting means so as to provide an output signal which is an anti-logarithmic function of the sum of the first signal and the gain control signal. More specifically, the Blackmer circuit comprises an input operational amplifier having a pair of feedback paths, one being conductive when the input signal is of a positive polarity, the other being conductive when the input signal is of a negative polarity. In the preferred form of the Blackmer circuit, each feedback path includes a log device, for converting the input signal of the correct polarity into a log form. Each log device in each path has connected to it an antilog device for converting the log signal together with the gain control signal into an antilog form. The log devices are preferably collector-emitter circuits of transistors of opposite conductivity types, i.e. pnp and npn transistors, since such circuits exhibit log-linear transfer characteristics. Similarly, the antilog devices are typically emitter-collector circuits of transistors of opposite conductivity types, since such circuits exhibit antiloglinear transfer characteristics. A control signal is summed with the log signal of each path by applying the voltage to the bases of the log and the antilog transistors, thereby controlling the gain of the circuit.

Although the Blackmer circuit, employing the four core transistors as log and antilog devices, theoretically provides substantially zero distortion, as a practical matter commercially available transistors are not perfect. Thus, the output of the circuit may include some detectable distortion, although in the case of audio applications, it may not be readily discernable to the average listener. This detectable distortion contributed by the log and antilog core transistors can and often affects the overall gain of the circuit. This distortion can be attributed, at least in part, to two inherent characteristics of the core transistors: (1) each transistor has a finite current gain and (2) each transistor exhibits an inherent nonzero or parasitic base resistance. As a result of finite gain, when any base current is provided through the base of the transistor and applied across the parasitic base, a base voltage error results and a distortion component will be generated. Where the log converting and antilog converting transistors of each signal path are matched, at unity gain the distortion contributed by the log and antilog transistors of each signal path are equal and opposite and will cancel one another. However, as the gain shifts from unity gain, the amount of signal in the log converting transistors differs from that in the anti-log converting transistors and the distortions are not equal and thus will not cancel each other.

This distortion component typically will show up in standard SMPTE IM (intermodulation) distortion tests. The error voltage at the bases of these devices can be thought of as another control voltage signal which varies the gain of the circuit as the signal is changing, so that as the gain shifts from unity gain the amount of distortion tends to increase. For example, one IM distortion test performed on a typical Blackmer circuit at 100 $\mu$A RMS signal level showed substantially zero distortion at unity gain, a distortion of approximately 0.35% at ±10 dB gain, and approximately 0.475% at ±20 dB gain.

To correct for this distortion one suggested technique applies the input signal through a respective error-correcting resistor to each base of each log transistor. The values of the error correcting resistors are chosen so that when an input signal is present the voltage developed across each error-correcting resistor (which is outside the base of the respective transistor) will cancel the voltage error produced by the parasitic resistance of that transistor. A similar correction is provided by deriving a correction signal from the output of the Blackmer circuit and applying it through error-correcting resistors to the bases of the antilog devices. This technique is relatively complicated and expensive, and the correction circuit is difficult to adjust.

Accordingly, it is an object of the present invention to provide an improved analog multiplier circuit of the type having a logarithmic control response.

Another object of the present invention is to provide an improvement over the circuit described in the Blackmer patent.

And another object of the present invention is to provide an improved voltage control amplifier in which IM output distortion is substantially reduced in a relatively easy and inexpensive manner requiring at most, only simple adjustments.

These and other objects are achieved by an improved electrical gain control system of the type including first signal converting means for providing a first signal logarithmically related to an input signal; means for summing a gain control signal with the first signal; and second signal converting means for providing an output signal which is an anti-logarithmic function of the sum of the first signal and the gain control signal. The improvement comprises means for generating an error correction signal derived from a comparison of the output and input signals of the system, and means for summing the error correction signal with the first signal and the gain control signal so as to reduce the distortion in the second output signal.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein.

Figure 6A:
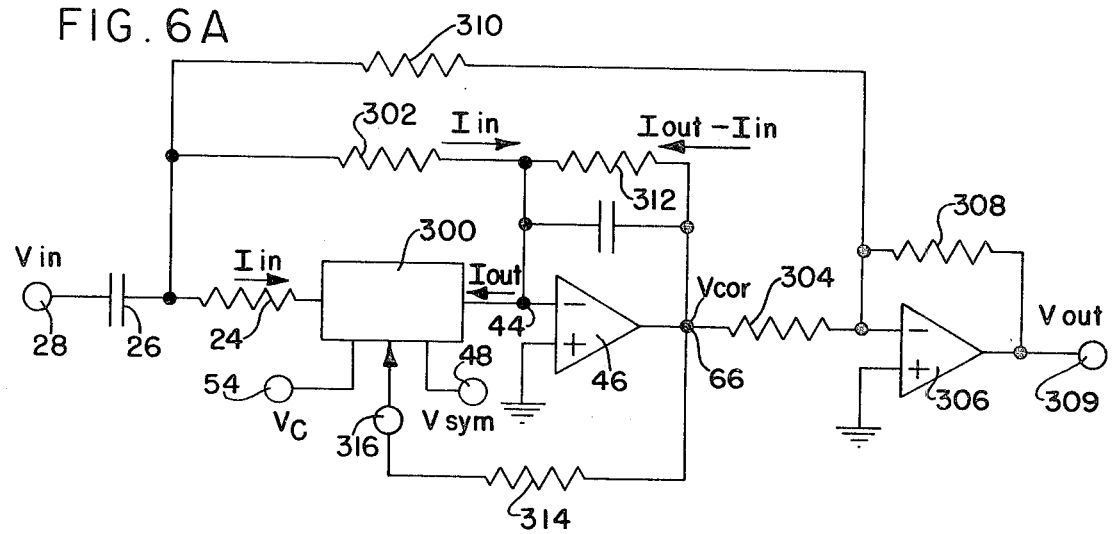
Figure 6B:
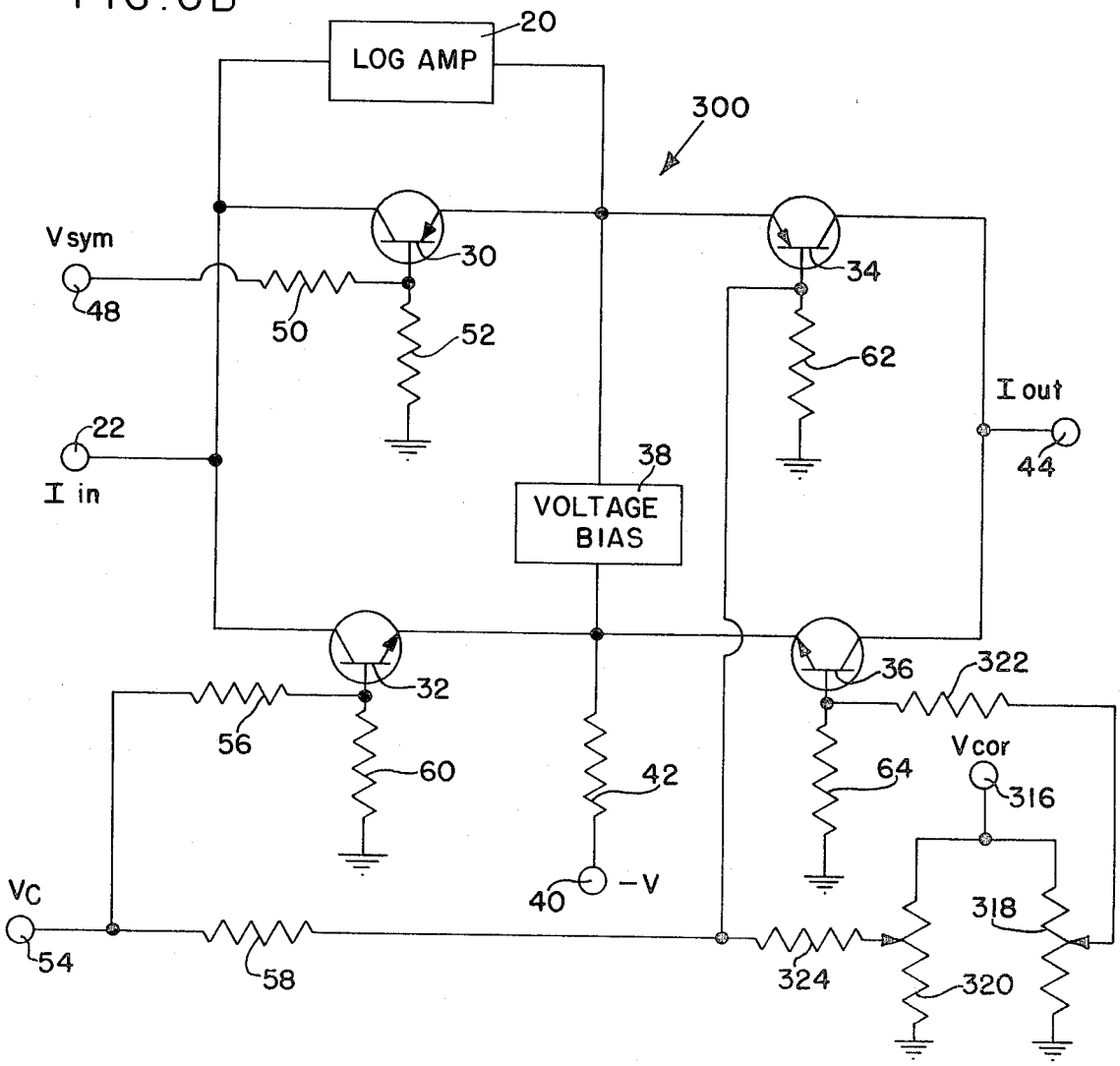
Figure 7:
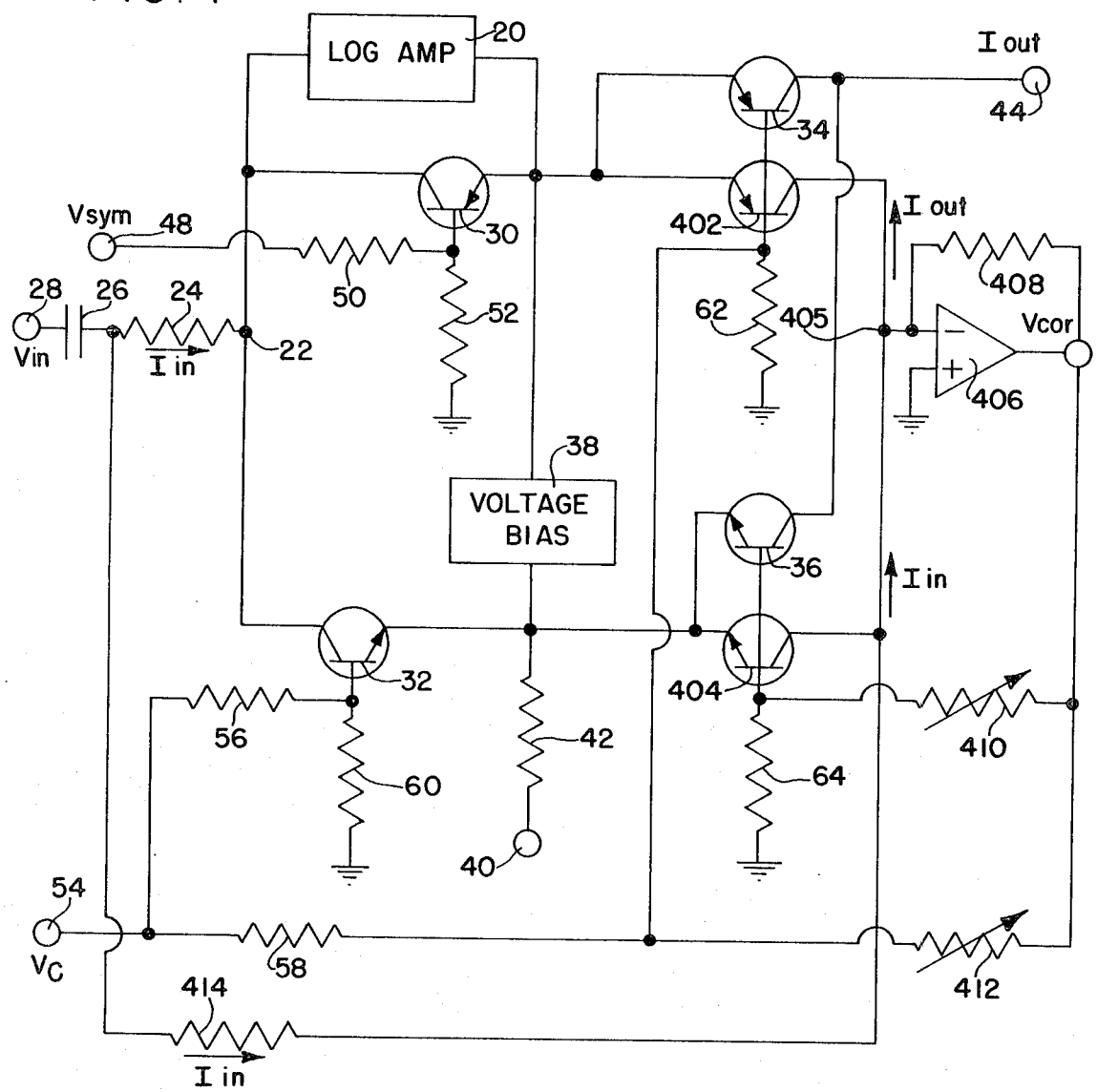

FIGS. 6A and 6B, taken together are, a schematic circuit diagram illustrating a third embodiment of the present invention; and FIG. 7 is a schematic circuit diagram illustrating a fourth embodiment of the present invention.

In the drawings, the same numerals are used to refer to like parts.

Figure 1:
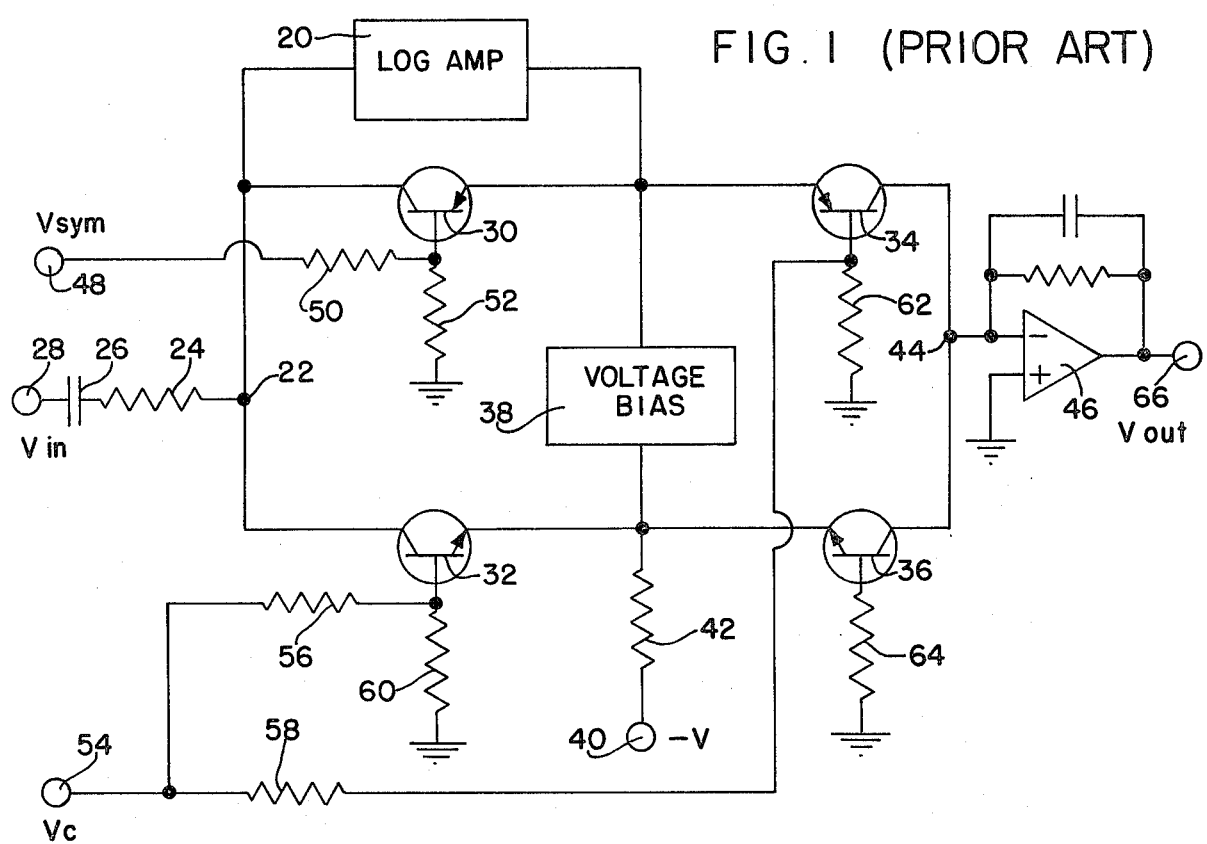
FIG. 1 is a schematic circuit diagram of the prior art gain control system of the type described in the Blackmer patent to which the present invention relates.

FIG. 1 shows one embodiment of the prior art signal control system of the type described and claimed in the Blackmer patent. The prior art system includes operational amplifier 20, which generally includes a high-gain inverting amplification stage having its input summing junction 22 connected through input resistor 24 and coupling capacitor 26 to input terminal 28. Amplifier 20 is typically designed to have a very low input bias current and voltage offset. The system includes the log-converting core transistors 30 and 32 and two antilog-converting core transistors 34 and 36. The first log-converting core transistor 30 has its emitter connected to the output of amplifier 20 and its collector to input junction 22. The second log-converter core transistor 32 has its collector connected to the input junction 22 and its emitter connected through voltage bias circuit 38 to the output of amplifier 20.

Transistor 34 and 36 form the antilog-converting core transistors, the former having its emitter connected to the emitter of transistor 30 and the latter having its emitter connected to the emitter of transistor 32. The collectors of transistors 34 and 36 are connected to one another and to the input summing junction 44 of a second operational amplifier 46 the latter for converting the system output current to a voltage at the output terminal 66.

Transistors 30 and 34 are preferably both of the same conductivity type, e.g. PNP type transistors, and are preferably matched for their $V_{be}$ characteristics. Transistors 32 and 36 are also preferably matched and both are of the same conductivity type but opposite to the type used for transistors 30 and 34, i.e. NPN type transistors. In order to provide symmetry between the first signal path defined by transistors 30 and 34 and the second signal path defined by transistors 32 and 36, a voltage potential can be provided to terminal 48 through resistor 50 to the base of one of the core transistors, e.g. as transistor 30. Similarly, in order to provide a biasing voltage for each core transistor, the bases of core transistors 30, 32, 34 and 36 are respectively connected to ground through resistors 52, 60, 62 and 64.

Voltage bias circuit 38 is biased by a negative bias voltage source, the latter being connected to terminal 40, through resistor 42, to the junction of circuit 38 and the emitters of transistors 32 and 36. Generally, voltage bias circuit 38 functions so that transistors 30 and 32 each constitute an oppositely-poled conductive feedback path around amplifier 20. As shown in FIG. 1, when the signal at terminal 28 is of a positive polarity, transistors 32 and 36 will be conductive, and transistors 30 and 34 will be cut-off. Conversely, when the signal at terminal 28 is of a negative polarity, transistors 30 and 34 will be conductive and transistors 32 and 36 will be cut-off.

In order to sum a control signal with each log signal of the signal paths, one signal path being defined by transistors 30 and 34 and the other by transistors 32 and 36, a second system input or control terminal 54 is provided, connected through resistors 56 and 58 to the bases of the log-converting core transistor of one signal path and the antilog-converting core transistor of the other signal path, e.g. transistors 32 and 34 as shown in FIG. 1. It will be appreciated that one can alternatively apply the control voltage to the bases of transistors 30 and 36, or where extremes in gain (or attenuation) are required, all four core transistors can be controlled as shown in the Blackmer patent.

In operation, a correcting voltage potential, if necessary, is applied to terminal 48 so as to provide symmetry between the two signal paths and a biasing potential is applied to terminal 40. The input signal is applied to input terminal 28 and the control signal is applied to terminal 54 and thus to the bases of transistors 32 and 34. Since transistors 30 and 32 are connected to provide feedback paths around amplifier 20, and are of opposite conductivity types, they function as logarithmic converters to convert, respectively, the positive and negative portions of the input signal to amplifier 20 (provided at terminal 28) into a logarithmic form. Transistors 34 and 36 serve as antilog converters which reconvert these log signals into linear currents. The control signal applied to the bases of transistors 30 and 32 provides the gain control for the current flowing in the collector emitter circuits of transistors 30 and 32 and the emitter collector circuits of transistors 34 and 36. The application of the control voltage at terminal 54 and thus to the transistor bases 32 and 34, approximates adding the control voltage to the tied emitters of transistors 30 and 34, and the emitters of transistors 32 and 36. This, in turn, is equivalent to adding the control signal to the log signal at those emitters.

Voltage bias circuit 38 permits the cross-over region between polarities transmitted over the signal paths to be filled.

It will be appreciated that if the control voltage at terminal 54 is zero, with balanced transistors 30, 32, 34 and 36, the circuit gain will be unity. However, as the control voltage at terminal 54 increases, certain distortion components can be detected in the output current at the junction 44 and output voltage at output terminal 66 of the system, in part, due to the finite gain and parasitic resistances of transistors 30, 32, 34 and 36. Accordingly, in accordance with the present invention, this distortion is substantially reduced by deriving an error correction signal for each signal path by comparing the input and output signals of the circuit, and summing the error correction signal with the log signal and control signal of the corresponding signal path.

Figure 3:
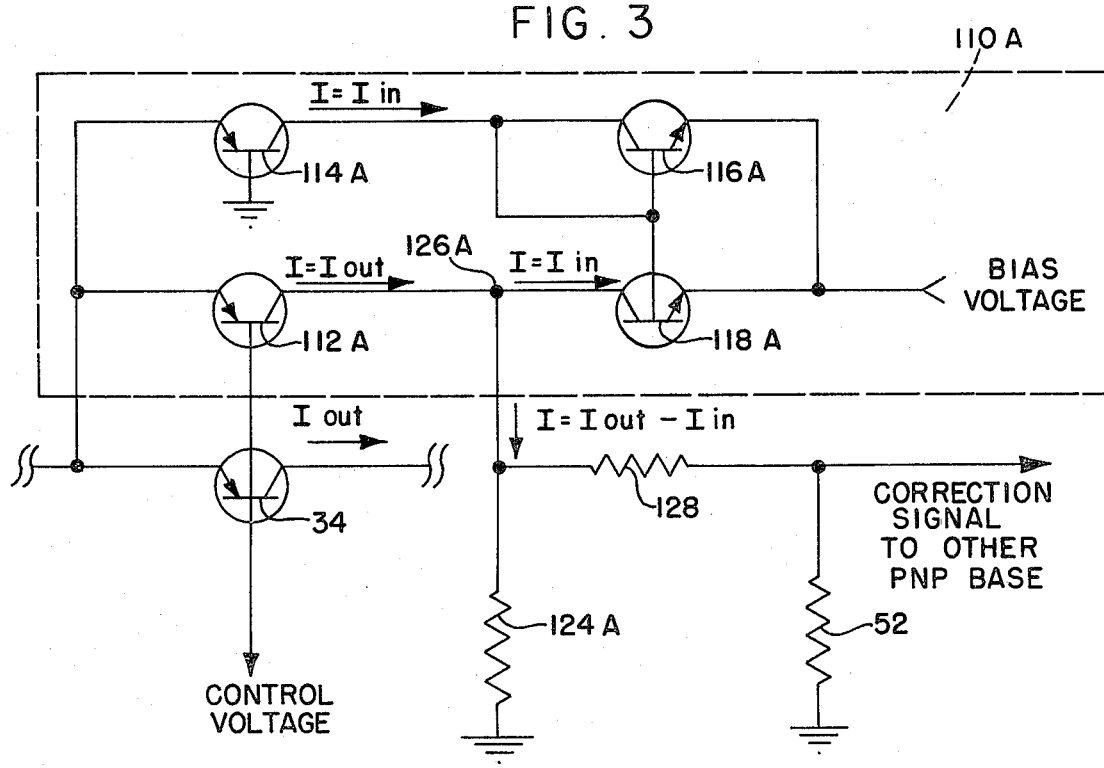
FIG. 3 is a schematic circuit diagram of a portion of the circuit of FIG. 2 to help illustrate the operation of the circuit of FIG. 2.
Figure 2:
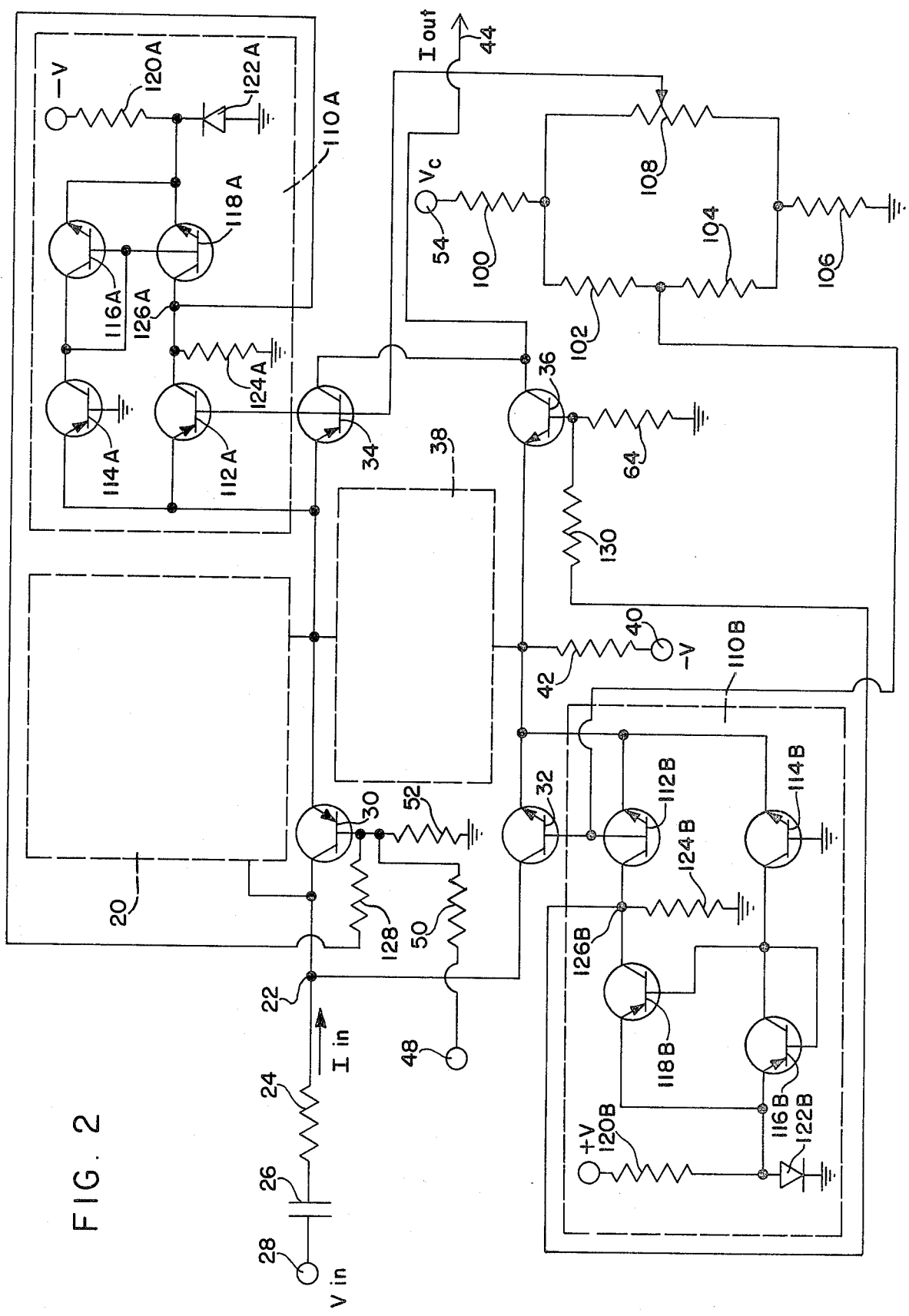
FIG. 2 is a schematic circuit diagram of the preferred embodiment of the present invention.

Referring to FIGS. 2 and 3, the preferred embodiment of the present invention operates in a current mode and includes substantially the arrangement of the circuit of FIG. 1 with slight modifications and the addition of means for generating an error correction signal for each signal path. Each error correction signal is derived from a comparison of the output and input current of the system and applied to the base of a core transistor of the respective signal path.

More specifically, the circuit is modified by omitting base resistors 60 and 62 and instead applying the control voltage signal, provided at terminal 54, through common resistor 100 and resistor 102 to the base of transistor 32, with resistor 104 and common resistor 106 connecting the base of transistor 32 to ground. Similarly, the control voltage signal applied at terminal 54, is applied through common resistor 100 and the adjusted resistance of potentiometer 108 to the base of transistor 34, with the base of the latter connected to ground through the adjusted resistance provided by potentiometer 108 and common resistor 106. As in the prior art FIG. 1 embodiment, the control signal is applied to the base of only one core transistor of each signal path. It will be appreciated that the adjustment of potentiometer 108 provides the necessary adjustment to match the log-linear characteristics of the npn and pnp core transistors; while resistors 104 and 106 and the resistance provided between potentiometer 108 (including resistor 106) and ground provides respectively the biasing resistances to the bases of core transistors 32 and 34.

The means for deriving and generating the correction signals for the signal path preferably includes separate error correction signal generating means 110 for each of the signal paths. Preferably, where the control signal at terminal 54 is applied to only one core transistor of each signal path, as shown in FIG. 2, the signal generating means 110A and 110B are respectively connected to the emitter and base of the core transistors of the corresponding signal paths receiving the control voltage signal, i.e. core transistors 32 and 34. As shown in FIGS. 2 and 3, means 110A preferably includes a first transistor 112A of the same conductivity type as transistor 34, i.e. a PNP transistor, with its emitter and base connected respectively to the emitter and base of the core transistor 34. A second transistor 114A, also preferably of the same conductivity type (and matched for $V_{be}$ characteristics) as transistor 112A, has its emitter tied to the emitter of core transistor 34 and its base connected to ground. The collectors of transistors 112A and 114A are connected to a current mirror. The latter is well known in the art and is generally formed by two identical transistors 116A and 118A, with their bases tied together, the collector of transistor 116A connected to its base, and the emitters of transistors 116A and 118A tied together and to a voltage bias source. The latter is formed by a negative voltage applied across resistor 120A, whic is in turn connected to the emitters of transistors 116A and 118A and to the cathode of diode 122A, which in turn has its anode connected to ground. Finally, biasing resistor 124A connects the node or junction 126A of the collectors of transistors 112A and 118A to ground. As will be more evident hereinafter, the error correction signal appears at the junction 126A and, as shown is applied through resistor 128 to the base of core transistor 30.

With respect to the operation of signal generating means 110A it will be appreciated, that although the base of transistor 114A is connected to ground, and the base of core transistor 30 (to which the error correction signal provided by means 110A is applied) is connected through resistor 52 to ground, the base-emitter voltages of the two transistors are always approximately the same with the possible exception of the symmetry voltage correction. This is true when one considers that the error correction signal (which is added to the base-emitter voltage of transistor 30) is very small (in the order of 100 times smaller) than the actual signal voltage. Thus, one can approximate by stating that transistor 114A will have the same collector current as the core transistor 30. As shown in FIG. 3, this is represented by Iin. Since transistors 34, 112A and 114A are substantially matched and the bases of transistors 34 and 112A are tied together, these latter two transistors exhibit the same base-emitter voltage and thus produce the same collector current, which is a current equal to the output current Iout appearing at junction 44. Thus, as shown in FIG. 3, the collector current of transistor 114A approximates the input current Iin and the collector current of transistor 112A will equal the output current Iout. The collector current of transistor 114A is transmitted to the collector of transistor 116A which forms a current mirror with transistor 118A. As well known in the art, as a result of the bias voltage provided by the negative potential across resistor 120A and diode 122A, a current equal to the collector current in transistor 116A will be generated in the collector of transistor 118A.

In accordance with Kirchhoff's Law, (which states that the sum of the currents into a node equal the sum of the currents out of the node) the error correcting current generated at junction 126A will approximate Iout—Iin. The error correcting current is converted to an error correcting voltage across resistor 124A and can be attenuated by resistors 128 and 52 and applied to the base of core transistor 30 so as to at least substantially reduce the distortion error voltage arising from parasitic resistances and finite gain of the core transistors. It should be appreciated that by producing the error correction voltage across resistor 52, the error correction voltage is actually added to the log signal and gain control signal provided at the emitter of transistor 30 when transistor 30 is conductive.

In a similar manner the error correction signal generating means 110B for the other signal path, is identical to the error correction signal generating means 110A except that transistors 112B and 114B are of the same conductivity type (and matched with respect to its $V_{be}$ characteristics) with core transistor 32 and thus are of a opposite conductivity type to the corresponding transistors 112A and 114A. The current mirror, comprising transistors 116B and 118B, is for a signal of an opposite polarity than that provided to transistor 116A and 118A and thus transistors 112B and 114B are of an opposite conductivity type than that provided for transistors 112A and 114A. Additionally, the emitters of transistors 116B and 118B form the current mirror are connected through biasing resistor 120B to a positive potential and to the anode of diode 122B which in turn has its cathode connected to ground. The error correction signal provided at junction 126B of the collectors of transistors 112B and 118B is preferably applied through attenuating resistor 130 to the base of transistor 36.

The error correction signal generating means 110B operates in similar manner as means 110A for input signals of an opposite polarity, with the error correcting signal being applied to the base of core transistor 36.

Figure 4:
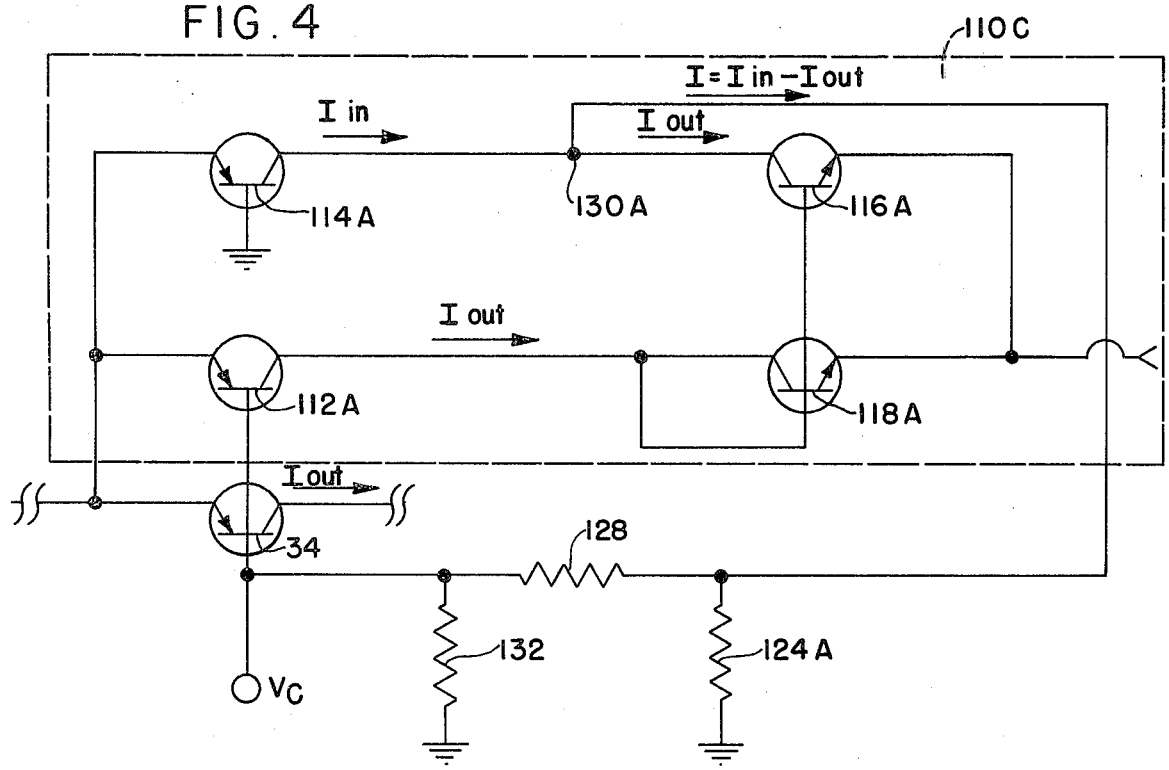
FIG. 4 is a schematic circuit diagram illustrating a modification to the circuit of FIG. 2.

In FIG. 2 embodiment, an error correction signal is generated for each polarity of the input signal at terminal 28, and applied to each of the two signal paths defined by the core transistors 30, 32, 34 and 36. It will be appreciated that although the error correction signal is derived from one core transistor of each signal path of the FIG. 2 embodiment, i.e. core transistors 32 and 34, and applied to the bases of the remaining corresponding core transistors, i.e., core transistors 30 and 36, alternatively the error correction signal can be applied to the base of the same core transistor from which the error correction signal is generated. For example, as shown in FIG. 4, the signal generating means 110C is identical to the signal generating means 110A of FIGS. 2 and 3 in that the same individual components are utilized. The core transistor 34, transistors 112A and 114A, and transistors 116A and 118A are connected to one another in the same manner as previously described except that the transistors 116A and 118A are connected together so as to define a current mirror for generating a duplicate current of Iout instead of Iin as in FIG. 2. Specifically, the bases of transistors 116A and 118A are connected together, the emitters of these transistors are connected together and to the biasing voltage as previously described with respect to FIGS. 2 and 3, and the base of transistor 118A is connected to its collector. In this instance the current generated in the collector of transistor 112A (in the same manner as previously described with respect to FIGS. 2 and 3) will be equal to the collector current of transistor 118A, which in turn will be equal to the collector current of transistor 116A. This current is equal to Iout. In this modification, the error correction signal is derived from the junction 130A of the tied collectors of transistors 114A and 116A, and is equal to Iin—Iout. The error correction current is converted to a voltage across resistor 124A, attenuated by resistors 128 and 132 (resistor 132 being the resistance offered by potentiometer 108 and resistor 106 of FIG. 2), and applied to the base of core transistor 34 so as to at least substantially reduce the distortion error arising from the parasitic resistances and finite gain inherent in core transistors 30 and 34. Again the application of the error correction voltage to the base of core transistor 34 is equivalent to adding the correction signal to the log signal and gain control signal provided at the emitter of transistor 34 when transistor 34 is conductive.

It should be noted that an equivalent modification can be made to the error correction signal generating means 110B of FIG. 2, so that the error correction signal can be derived from core transistor 32 and applied to the base of the same transistor.

Although the error correcting signals are described in FIGS. 2-4, as being derived from core transistors 32 and 34, the present invention also can be realized by deriving the respective error correction signals for each polarity of the input signal at input terminal 28 from core transistors 30 and 36. The only restriction with respect to these embodiments described with respect to FIGS. 2-4 of the above-noted modifications is that each error correcting signal derived from one of the core transistors of each respective signal path be applied to the base of either the same core transistor or the other core transistor of the same signal path. Thus, an error correction signal derived by either one of transistors 30 and 34 must be applied to the base of the other in a manner described with respect to FIGS. 2 and 3 or to its own base in a manner described with respect to FIG. 4. Similarly, an error correction signal derived by either one of transistors 32 and 36 must be applied to the base of the other in the manner described in FIGS. 2 and 3 or to its own base in a manner suggested to FIG. 4.

Figure 5:
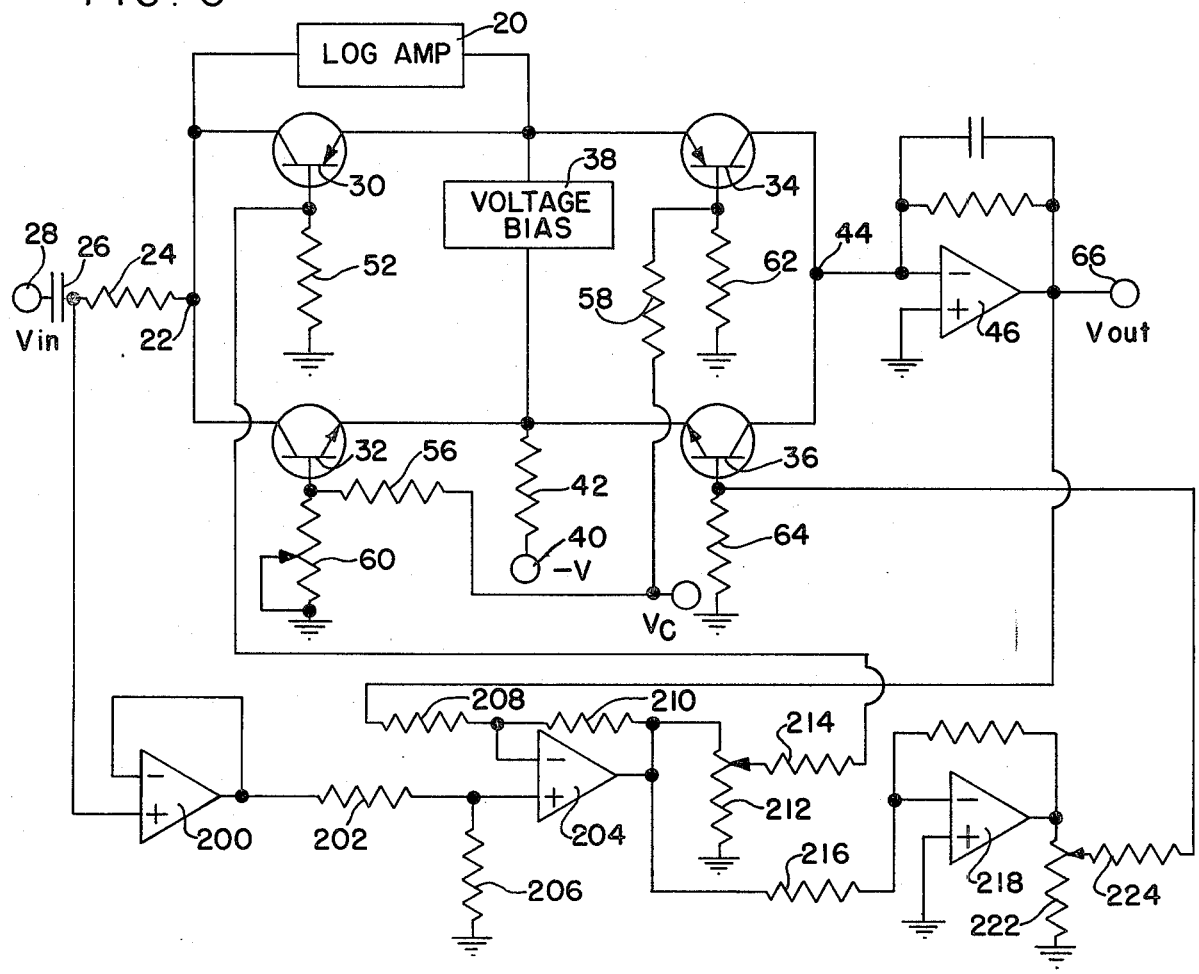
FIG. 5 is a schematic circuit diagram illustrating another embodiment of the present invention.

Other embodiments of the present invention are shown in FIGS. 5-7. Referring to FIG. 5, the device shown is adapted to operate in a voltage mode in carrying out the principles of the present invention. More specifically, the input voltage at the junction between input capacitor 26 and resistor 24 is connected through buffer 200 to input resistor 202. Resistor 202 is in turn connected to the positive input of differential amplifier 204, the positive input being biased to ground through resistor 206. The output system terminal 66 is connected through resistor 208 to the negative input terminal of amplifier 204, the latter terminal being connected through feedback resistor 210 to the output terminal of amplifier 204. Differential amplifiers, well known in the art, generally compare the voltage amplitude of the signal at their positive input terminals with the voltage amplitude of the signal at their negative input terminals and generate output signals equal to the difference. The output of amplifier 204 is connected through the resistor of potentiometer 212 to ground with the tap of potentiometer 212 connected, through resistor 214 to the base of core transistor 30. The output of amplifier 204 is also connected through input resistor 216 to the negative input of the inverting amplifier 218. The latter has its positive input to ground and the negative input connected to its output through feedback resistor 220, and generally functions to invert the signal at its negative input. The output of inverting amplifier is connected through the resistor of potentiometer 222 to ground. The tap of potentiometer 222 is connected through resistor 224 to the base of core transistor 36.

In operation, the signal appearing at the positive input of differential amplifier 204 corresponds to the input voltage Vin, while the signal appearing at the negative input of amplifier 204 corresponds to the output voltage Vout. The output of amplifier 204 is thus a signal corresponding to Vout-Vin, which is applied through potentiometer 212 to the base of core transistor 30 and through inverter 218 to the base of core transistor 36. It will be appreciated that the amount of attenuation of the correction signal applied to the bases of core transistors 30 and 36 can be adjusted by respectively adjusting the amount of resistance provided by potentiometers 212 and 222. Where the input and output signals are of a positive polarity the correction signal derived from the comparison of the input and output signals is applied directly (in a polarity sense) to the base of core transistor 30. Under these conditions the core transistors 32 and 36 will be cut-off. However, where the input and output signals are of a negative polarity, the output of the differential amplifier 204 will be inverted by inverter 218 before being applied to the base of core transistor 36. Since core transistors 30 and 34 are cut-off when the input and output signals are of a negative polarity, the error correction signal will have no effect when applied to the bases of transistors 30 and 34 during these conditions.

Referring to FIGS. 6A and 6B, a third embodiment of the present invention which operates in a current mode includes the system of FIG. 6B, generally indicated at 300 in FIG. 6A. In FIG. 6A, a first resistor 302 is connected between the junction of capacitor 26 and resistor 24 and the output 44 of system 300. The output terminal 66 of the output amplifier 46 is connected through resistor 304 to the negative input of an inverting amplifier 306, the latter having its positive input connected to ground and its negative input also connected through feedback resistor 308 to its output terminal 309 and through feedback resistor 310 to the junction of capacitor 26 and resistor 24. In this embodiment the values of the resistors 24, 302 and feedback resistor 312 of the output amplifier 46 are all equal so that the current through resistor 302 is equal to the current flowing through resistor 24 i.e., equaling the input current to system 300. Since the current through resistor 302 is into the node formed by junction 44, and since the output current flowing from the same node into system 300 is equal to the output current, in accordance with Kirchhoff's Law, the current flowing through resistor 312 into the node formed by junction 44 equals the output current less the input current, i.e. Iout-Iin. This correction current flowing through resistor 312 is converted to a correction voltage at junction 66. This voltage correction signal is applied through resistor 314 to the correction input terminal 316 of the system 300.

Referring to FIG. 6B, the correction voltage signal, applied to terminal 316, is applied to the bases of both the antilog converting core transistors 34 and 36 so that no inverter is necessary. More specifically, the correction input terminal 316 is connected through the resistor of potentiometer 318 to ground and through the resistor of potentiometer 320 to ground. The tap of potentiometer 318 is connected through resistor 322 to the base of core transistor 36 and the tap of potentiometer 320 is connected through resistor 324 to the base of core transistor 34 so that the correction signal is applied to the bases of the two transistors and adjustment of potentiometers 318 and 320 provide the desired attenuation for the respective signal paths. Although the correction signal is applied to the bases of both antilog converting core transistors, it could alternatively be applied out of phase to log converting core transistors, since in both instances the correction signal is added to both the log and gain control signals appearing at the emitters of the core transistors when the particular signal path defined by either the core transistors 30 and 34 or core transistors 32 and 36 is conductive.

In FIG. 7, the embodiment shown is designed to operate in a current mode. In this embodiment transistor 402 has its emitter and base respectively tied to the emitter and base of the antilog converting core transistor 34, while transistor 404 has its emitter and base respectively tied to the emitter and base of the antilog converting core transistor 36. Transistors 402 and 404 are of the same type and preferably matched to one another and to core transistors 34 and 36 for their $V_{be}$ characteristics. The collectors of transistors 402 and 404 are tied together and connected through junction 405 to the negative input of differential amplifier 406. The positive input of amplifier 406 is connected to ground while the negative input is connected through feedback resistor 408 to the output of the amplifier. The output of amplifier 406 is connected through variable resistor 410 to the base of core transistor 36 (and the base of transistor 404) and through variable resistor 412 to the base of core transistor 34 (and the base of transistor 402). Finally, a resistor 414 is connected between the junction of capacitor 26 and resistor 24 and the junction 405. The resistance value of resistor 414 is made equal to the resistance value of resistor 24.

In operation the current through resistor 414 will equal the current through resistor 24 which equals the input current Iin. The output current at junction 44 will be duplicated in either the collector of transistor 402 or the collector of transistor 404 depending on the polarity of the input signal at input terminal 28. Thus, the input current to the negative input terminal of amplifier 406 will correspond to the difference between the input and output currents Iin and Iout. The amplifier 406 converts this current to a voltage correction signal, which, in turn, is applied through variable resistors 410 and 412 to the bases of the antilog core transistors 34 and 36 so that the correction signal is added to the log signal and gain control signal when the particular signal path, is conductive. The desired attenuation of the correction signal applied to each of the bases of core transistors 34 and 36 is selectively achieved by adjusting the variable resistors 410 and 412.

The above-described invention thus provides an improvement over the gain control circuits such as the one described in U.S. Pat. No. 3,714,462 issued to David E. Blackmer by at least reducing the amount of distortion in the output signal. This has been demonstrated by testing a typical circuit incorporating the principles of the present invention under the same IM distortion test previously described. In this instance the amount of distortion at 100 μA RMS signal level and from unity gain through ±20 dB gain was reduced to about 0.100% or less.

Since certain changes may be made in the above apparatus without departing from the scope of the invention involved, it is intended that all matter contained in the above description or shown in the accompanying drawing shall be interpreted in an illustrative and not in a limiting sense.

What is claimed is:

1. In an electrical gain control system including first signal converting means for providing at its output a first output signal logarithmically related to an input signal; means coupled with respect to the output of said first signal converting means for summing a gain control signal with said first output signal; and second signal converting means for providing at its output a second output signal which is an anti-logarithmic function of the sum of said first output signal and said gain control signal, the improvement comprising:
    signal generating means for comparing said input signal and said second output signal and for generating, in response to said comparison, an error correction signal as a function of the distortion in said second output signal; and
    means coupled with respect to the output of said first signal converting means for summing said error correction signal with said first output signal and said gain control signal so as to reduce said distortion in said second output signal.

2. In an electrical gain control system including two signal paths for respectively transmitting the positive and negative polarity portions of an input electrical signal, each of said paths including (1) corresponding first signal converting means for providing at its output a first output signal logarithmically related to the corresponding portion of said input signal; (2) means coupled with respect to the output of said first signal converting means for summing a gain control signal with said first output signal; and (3) second signal converting means for providing at its output a second output signal which is an antilogarithmic function of the sum of said first output signal and said gain control signal, the improvement comprising:
    signal generating means for comparing said input signal and each said second output signal and for generating, in response to said comparison, an error correction signal as a function of the distortion in said each second output signal; and
    summing means coupled with respect to the output of each of the first signal converting means for summing said error correction signal of each signal path with the corresponding first output signal and gain control signal in each of the respective signal paths so as to reduce said distortion in said second output signal.

3. A system according to claim 1, wherein said first signal converting means includes the collector-emitter path of a first transistor and said second converting means includes the emitter-collector path of a second transistor, the emitters of said first and second transistors being coupled to one another.

4. A system according to claim 3, wherein said signal generating means includes first means for generating a third signal representative of said input signal, second means for generating a fourth signal representative of said output signal, subtracting means for providing the difference between said third signal and said fourth signal so as to produce said error correction signal, and said summing means includes means for applying said error correction signal to the base of one of said first and second transistors.

5. A system according to claim 4, wherein said signal generating means further comprises a current mirror having third and fourth transistors, said first means for generating includes a fifth transistor having its emitter connected to the emitter of said first transistor so as to generate said third signal through the collector of said fifth transistor, the collector of said fifth transistor being connected to said third transistor; said second means includes a sixth transistor having its emitter and base respectively connected to the emitter and base of one of said first and second transistors so as to generate said fourth signal through the collector of said sixth transistor, said collector of said sixth transistor being connected to said fourth transistor.

6. A system according to claim 5, wherein said subtracting means comprises a node between said fourth and sixth transistors so as to generate said error signal as a function of the sum of said fourth signal less said third signal.

7. A system according to claim 5, wherein said subtracting means comprises a node between said third and fifth transistors so as to generate said error signal as a function of the sum of said third signal less said fourth signal.

8. A system according to claim 3, wherein said signal generating means includes a differential summing amplifier having positive and negative input terminals, means for applying a third signal representative of said input signal to one of said input terminals and means for applying a fourth signal representative of said second output signal to the other of said input terminals so that said error correcting signal is a signal which is a function of the difference between said input and output signals, and wherein said summing means includes means for applying said error correcting signal to the base of one of said first and second transistors.

9. A system according to claim 8, wherein said means for applying said error correction signal includes means for variably attenuating the output of said amplifier so as to adjust said error correction signal.

10. A system according to claim 3, wherein said signal generating means includes means connected between the input and output terminals of said system so as to transmit a current representative of said input signal to said output terminal and so as to form a node at said output terminal, and said summing means includes means connected between said node and the base of one of said first and second transistors so as to generate a current signal equal to the difference between said current and the current of said output signal.

11. A system according to claim 2, wherein said signal generating means comprises respective signal generators for each of said signal paths for comparing said input signal with the respective second output signal.

12. A system according to claim 2, wherein said signal generating means includes a differential summing amplifier having positive and negative input terminals, means for applying a third signal representative of said input signal to one of said input terminals and means for applying a fourth signal representative of said second output signal to the other of said input terminals so that said error correcting signal is a signal which is a function of the difference between said input and output signals, and wherein said summing means includes means for applying said error correcting signal to the base of one of said first and second transistors.

13. A system according to claim 12, wherein said error correction signals for both signal paths are each a function of and derived from said amplifier output signal.

14. A system according to claim 2, wherein said signal generating means includes means connected between the input and output terminals of said system so as to transmit a current representative of said input signal to said output terminal and so as to form a node at said output terminal, and said summing means includes means connected between said node and the base of one of said first and second transistors so as to generate a current signal equal to the difference between said current and the current of said output signal.

15. A system according to claim 14, wherein said summing means includes means for applying a separate signal, representative of said current signal, to the base of one of said first and second transistors of each of said signal paths.

16. A system according to claim 2, wherein said signal generating means includes a third transistor, for each said signal path, having its emitter and base respectively connected to the emitter and base of said second transistor of the respective signal path and its collector to a node so as to generate a third signal representative of said second output signal at said node, means for providing a fourth signal representative of said input signal, and said summing means being connected to said node so as to generate said error correction signal as a function of the difference between said third and fourth signals, and means for applying said error correction signal to the base of one of said first and second transistors of each of said signal paths.

* * * * *